(12) United States Patent
Rockford

(10) Patent No.: US 6,699,798 B2
(45) Date of Patent: Mar. 2, 2004

(54) PROMOTING ADHESION OF FLUOROPOLYMER FILMS TO SEMICONDUCTOR SUBSTRATES

(75) Inventor: Lee D. Rockford, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 42 days.

(21) Appl. No.: 10/131,017

(22) Filed: Apr. 24, 2002

(65) Prior Publication Data

US 2003/0203647 A1 Oct. 30, 2003

(51) Int. Cl.[7] .............................................. H01L 21/31
(52) U.S. Cl. ....................................................... 438/780
(58) Field of Search ................................ 438/780, 762, 438/763, 765, 778–779

(56) References Cited

U.S. PATENT DOCUMENTS 4,938,995 A * 7/1990 Giordano et al. ............ 427/490
2002/0012884 A1 * 1/2002 Gleason et al. .............. 430/313

OTHER PUBLICATIONS

Badyal et al. "Applying fluoropolymer film to a body" EPAB (abstract, Pub–no WO009932235A1) Jul. 1, 1999.*

* cited by examiner

Primary Examiner—Craig A. Thompson
(74) Attorney, Agent, or Firm—Trop, Pruner & Hu, P.C.

(57) ABSTRACT

Adhesion of high fluorine content films to semiconductor substrates may be improved by forming an intervening adherence layer. The adherence layer may be formed from a plasma gas. In some cases, the adherence layer may be used to adhere photoresist for advanced photolithography processes to silicon substrates.

18 Claims, 2 Drawing Sheets

PROMOTING ADHESION OF FLUOROPOLYMER FILMS TO SEMICONDUCTOR SUBSTRATES

BACKGROUND

This invention relates generally to the processing of semiconductor integrated circuits.

High fluorine content solutions do not wet conventional semiconductor substrates, and high fluorine content polymers do not adhere well to conventional semiconductor substrates. High fluorine content polymers and polymer solutions may include photoresist for 157-nanometer lithography, as one example.

To improve the adherence of such high fluorine content materials to semiconductor substrates, a reactive chemical precursor in liquid or vapor phase is reacted with a substrate to covalently bond the precursor functional group to the substrate. The presence of a new functional group at the surface of a substrate changes the surface properties, promoting wetting of material spread, cast or sprayed onto the surface that now has chemical functionality similar to the end groups of the reactive chemical precursor.

Generally, liquid/vapor phase processing involves expensive, specially designed surface active molecules. Moreover, the chemicals are effective only on the surfaces that the precursor molecules are specifically designed for. Thus, the existing surface modification technique may be inflexible and relatively expensive.

Thus, there is a need for better ways to adhere high fluorine content materials to a wider range of semiconductor substrates.

DETAILED DESCRIPTION

A polymer film with high fluorine content may be produced by plasma polymerization and deposition. A polymer film may be grown from a substrate surface in a microwave plasma with the appropriate feed gases and process conditions in one embodiment. The film is adherent since it is covalently bound to the substrate during polymerization. The polymer film promotes wetting during subsequent spin casting, dip coating or spray coating of high fluorine content polymer solutions, and adhesion of the dried high fluorine content polymer film once the solvent evaporates from solution.

An example of a high fluorine content polymer is the fluoropolymer photoresist used in photolithography with light having a wavelength of 157 nanometers. Adhesion may be facilitated by the favorable surface energy between the plasma polymerized fluoropolymer film and the high fluorine content coated film.

Figure 1:
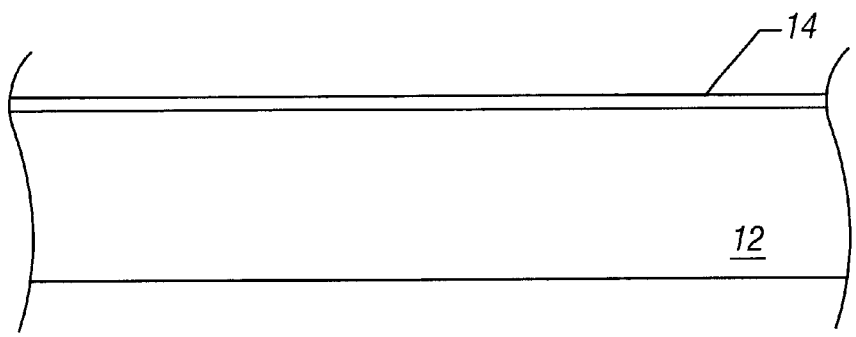
FIG. 1 is an enlarged, cross-sectional view at an early stage of manufacture in accordance with one embodiment of the present invention.
Figure 2:
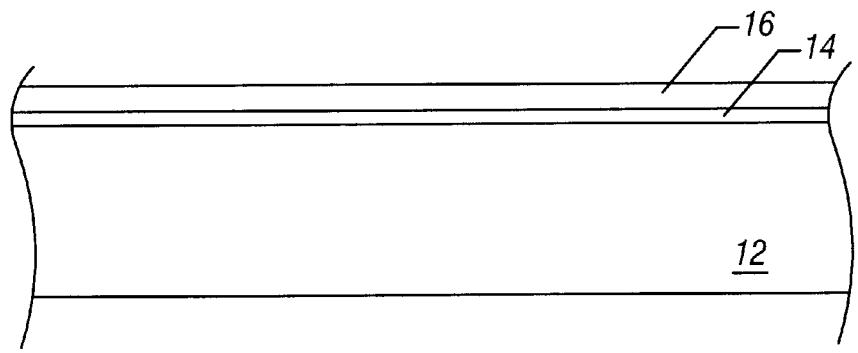
FIG. 2 is an enlarged, cross-sectional view at a subsequent stage of manufacture in accordance with one embodiment of the present invention.

Thus, referring to FIG. 1, the fluoropolymer film 14 may be grown or otherwise formed on a semiconductor substrate 12, which may be a silicon substrate in one embodiment of the present invention. Other examples of substrate 12 include silicon-oxy-nitride, silicon nitride, silicon carbide, and polysilicon. The fluoropolymer film 14 may be grown in a microwave plasma, for example. Next, the layer 16 to be adhered to the substrate 12 may be formed as shown in FIG. 2. Adhesion is facilitated by the intervening film 14. In some embodiments, the layer 16 is formed of a high fluorine content polymer or polymer solutions such as photoresist.

Figure 3:
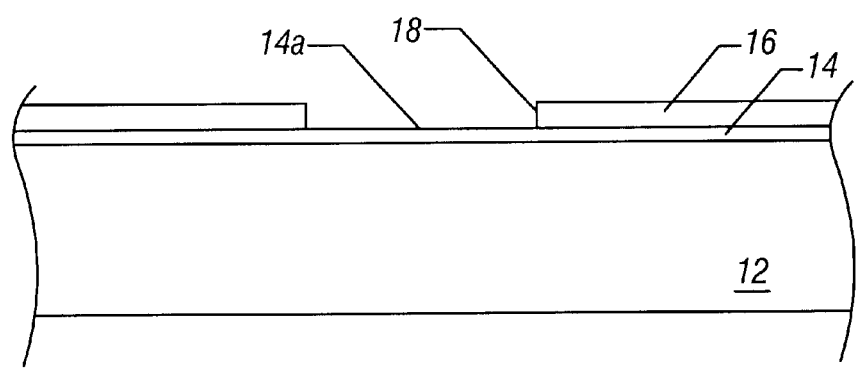
FIG. 3 is an enlarged, cross-sectional view at a subsequent stage of manufacture in accordance with one embodiment of the present invention.

In some embodiments, for example where the layer 16 is a photoresist, the layer 16 may be patterned. The patterning may result in exposure and removal of a portion of the layer 16 to form the opening 18, exposing the portion 14a of the film 14, as shown in FIG. 3.

Figure 4:
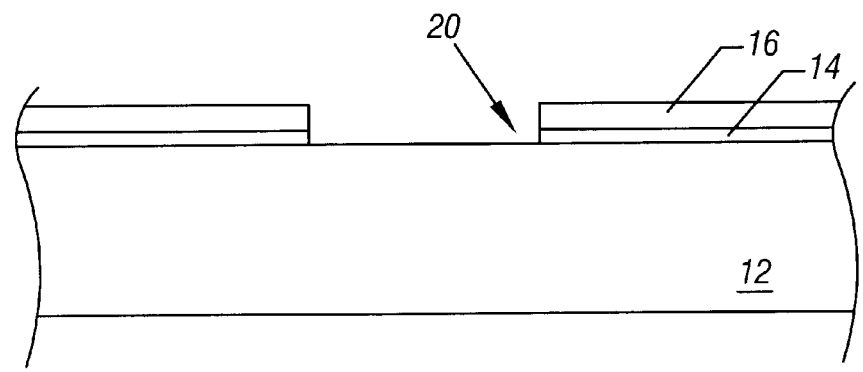
FIG. 4 is an enlarged, cross-sectional view at a subsequent stage of manufacture in accordance with one embodiment of the present invention.

Subsequently, the film 14a may be removed where exposed to result in the structure shown in FIG. 4. For example, a short $O_2$ plasma etch may be used to remove the film 14a.

Figure 5:
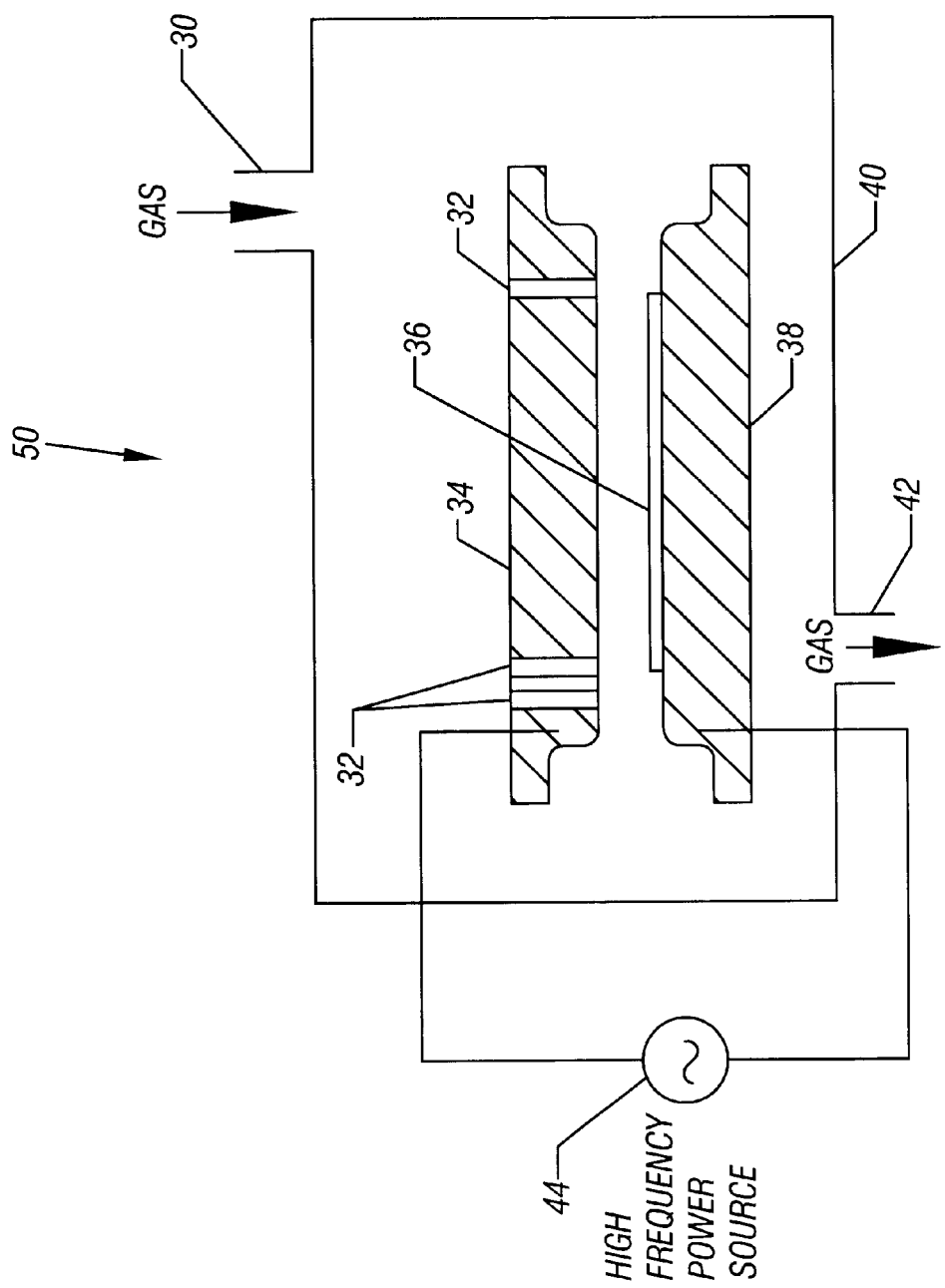
FIG. 5 is an enlarged, schematic depiction of an etcher useful in connection with one embodiment of the present invention.

The fluoropolymer film 14 may be grown from the plasma state on a silicon substrate 12, for example, using a Tokyo Electron Limited (Tokyo, Japan) radio frequency plasma oxide etcher 50, shown in FIG. 5. The etcher 50 may have a chamber 40 that is hermetically sealed.

An upper electrode 34 and a lower electrode 38 may be spaced a predetermined distance from one another within the chamber 40. A radio frequency voltage is applied to the electrodes 34 and 38 from a radio frequency power source 44. A number of fine holes 32 are formed in the upper electrode 34 to admit process or reaction gas. The lower electrode 38 acts as a susceptor having an upwardly facing surface on which a semiconductor wafer 36 or an object to be processed is placed. The opposed surfaces of the upper and lower electrodes 34 and 38 are substantially parallel.

A top wall of the chamber 40 has a gas introduction port 30 coupled to a gas source. The chamber 40 bottom wall has an exhaust port 42 coupled to an exhaust device. The process gas or an etching gas is introduced into the chamber 40 through the port 30, flowing through the holes 32 in the upper electrode 34 into the space between the electrodes 34 and 38. There the etching gas is converted into a plasma. As a result, the film 14 may be formed on the semiconductor wafer 36. During that process, the chamber 40 is exhausted through the exhaust pipe 42 to maintain a predetermined vacuum level.

The etcher 50 may have the following settings in one embodiment: a gap between electrodes 34 and 38 of 27 millimeters; a chamber pressure of 62 milliTorr; a radio frequency power of 100 Watts; an inert gas flow of 230 standard cubic centimeters per minute (sccm); an upper electrode temperature of 60° C.; a wall temperature of 60° C.; and a lower electrode temperature of 20° C.

In some embodiments, various proportions of gases containing carbon, hydrogen, fluorine, and oxygen may be utilized. Suitable gases include $C_4F_8$, $CH_2F_2$, and $CF_4$. The flow rates for $C_4F_8$ may be in the range of from 0 to 30 sccm in some embodiments. For $CH_2F_2$, the flow rate may be between 10 and 50 sccm in some embodiments. For $CF_4$, the flow rate may be from 0 to 100 sccm in some embodiments.

The film 14's thickness is directly dependent on plasma time, with typical growth rates on the order of 10 Angstroms per second, measured by X-ray reflectivity. Film composition, measured by XPS, may show the presence of fluorine, and water contact angles ranging from 80 to 104 degrees. Fluorinated 157 nanometer lithography photoresists were found to adhere to and develop on plasma polymerized silicon substrates, where adhesion has been shown to be poorer on non-modified silicon substrates.

Thus, in some embodiments, surface modification is achieved in a dry state in a plasma in a single step from bulk gases onto any surface. This may avoid the need for a liquid/vapor phase processing of expensive, specially designed surface active modules onto only the surfaces for which precursor molecules or specifically designed for.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:

forming a fluoropolymer layer from a plasma gas on a semiconductor substrate; and forming a second layer compositionally different from said fluoropolymer layer, said second layer containing fluorine, adhered to said substrate using said fluoropolymer layer.

2. The method of claim 1 wherein adhering includes forming a fluorine containing photoresist over said fluoropolymer layer.

3. The method of claim 2 including forming a photoresist for 157 nanometer lithography over said film.

4. The method of claim 1 including using plasma polymerization and deposition to form said layer.

5. The method of claim 1 including modifying the surface of said substrate in a dry state in a plasma.

6. A method comprising:

using plasma polymerization and deposition to form a fluoropolymer layer on a semiconductor substrate; and adhering a second layer containing fluorine to said substrate using said fluoropolymer layer such that said second layer and said fluoropolymer layer are compositionally different.

7. The method of claim 6 wherein adhering includes forming a fluorine containing photoresist over said fluoropolymer layer.

8. The method of claim 7 including forming a photoresist for 157 nanometer lithography over said layer.

9. The method of claim 6 including modifying the surface of said substrate in a dry state in a plasma.

10. A method comprising:

placing a semiconductor structure in a plasma chamber;

depositing a fluoropolymer layer from a plasma gas in said chamber; and forming a fluorine containing photoresist over said fluoropolymer layer.

11. The method of claim 10 including forming a photoresist for 157 nanometer lithography over said fluoropolymer layer.

12. The method of claim 11 including forming said fluoropolymer layer by plasma polymerization and deposition.

13. The method of claim 10 including modifying the surface of said structure in a dry state in the plasma.

14. The method of claim 10 including using a radio frequency plasma etcher to form said plasma.

15. The method of claim 14 including using a parallel plate plasma etcher.

16. The method of claim 10 including etching through said photoresist layer to said fluoropolymer layer.

17. The method of claim 16 including using a subsequent etch step to etch through said fluoropolymer layer.

18. The method of claim 17 including using an $O_2$ etch to etch through said fluoropolymer layer.

* * * * *